United States Patent
Fu et al.

(10) Patent No.: US 11,082,041 B2
(45) Date of Patent: Aug. 3, 2021

(54) SWITCHING CIRCUIT AND OPERATION METHOD

(71) Applicant: Realtek Semiconductor Corporation, Hsinchu (TW)

(72) Inventors: Hu-Ye Fu, Suzhou (CN); Zuo-Hui Peng, Suzhou (CN); Feng-Qiao Ye, Suzhou (CN); Jian Wang, Suzhou (CN); Yu-Xiang Qi, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/701,360

(22) Filed: Dec. 3, 2019

(65) Prior Publication Data

US 2020/0412358 A1    Dec. 31, 2020

(30) Foreign Application Priority Data

Jun. 28, 2019    (CN) .......................... 201910575174.3

(51) Int. Cl.
*H03K 17/60* (2006.01)
*H03K 17/56* (2006.01)
*H01L 29/93* (2006.01)

(52) U.S. Cl.
CPC ............. *H03K 17/56* (2013.01); *H01L 29/93* (2013.01)

(58) Field of Classification Search
CPC .................................. H03K 17/56; H01L 29/93
USPC ....................................................... 327/493
See application file for complete search history.

(56) References Cited

U.S. PATENT DOCUMENTS

| | | | |
|---|---|---|---|
| 7,489,094 B2 * | 2/2009 | Steiner ...................... | H02P 1/24 318/245 |
| 2014/0103818 A1 * | 4/2014 | Chen ...................... | H03K 17/133 315/159 |

FOREIGN PATENT DOCUMENTS

| | | |
|---|---|---|
| CN | 107844078 A | 3/2018 |
| CN | 108271299 A | 7/2018 |
| CN | 109618478 A | 4/2019 |
| CN | 108541123 B | 5/2019 |

\* cited by examiner

*Primary Examiner* — Metasebia T Retebo
(74) *Attorney, Agent, or Firm* — Locke Lord LLP; Tim Tingkang Xia, Esq.

(57) ABSTRACT

A switching circuit includes a live wire power obtaining circuit, a control circuit, and a tunable capacitor array. The live wire power obtaining circuit is coupled to a live wire to receive an alternating current (AC) voltage. The control circuit is configured to perform a zero-crossing detection to the alternating current voltage. The tunable capacitor array is coupled to the live wire power obtaining circuit and the control circuit. The control circuit is configured to control the live wire power obtaining circuit to supply power to the control circuit or the tunable capacitor array to discharge to supply power to the control circuit based on a state of a first switch and a zero-crossing detection result.

20 Claims, 3 Drawing Sheets

SWITCHING CIRCUIT AND OPERATION METHOD

RELATED APPLICATIONS

This application claims priority to Chinese Application Serial Number 201910575174.3, filed Jun. 28, 2019, which is herein incorporated by reference.

BACKGROUND

Technical Field

The present disclosure relates to a circuit technology. More particularly, the present disclosure relates to a switching circuit and an operation method.

Description of Related Art

With development of Internet of Things (IOT), many system chips are arranged with various loads (for example, illuminating devices). However, these loads may be activated by mistake (for example, flickering) when a current peak value or a current average value is too high.

SUMMARY

One embodiment of the present disclosure is related to a switching circuit. The switching circuit includes a live wire power obtaining circuit, a control circuit, and a tunable capacitor array. The live wire power obtaining circuit is coupled to a live wire to receive an alternating current voltage. The control circuit is configured to perform a zero-crossing detection to the alternating current voltage. The tunable capacitor array is coupled to the live wire power obtaining circuit and the control circuit. The control circuit is configured to control the live wire power obtaining circuit to supply power to the control circuit or the tunable capacitor array to discharge to supply power to the control circuit based on a state of a first switch and a zero-crossing detection result.

One embodiment of the present disclosure is related to a switching circuit. The switching circuit includes a live wire power obtaining circuit and a control circuit. The live wire power obtaining circuit is coupled to a live wire to receive an alternating current voltage. The control circuit is configured to control the live wire power obtaining circuit or an energy storage circuit to supply power to the control circuit according to a state of a switch and the alternating current voltage. The control circuit includes a network module control chip. Under a condition that the network module control chip executes a scanning process, the network module control chip enters a sleeping mode after a scanning of a first channel is finished, and a second channel is scanned after the sleeping mode is finished.

One embodiment of the present disclosure is related to an operation method of a switching circuit. The operation method includes: receiving an alternating current voltage by a live wire power obtaining circuit; performing a zero-crossing detection to the alternating current voltage by a control circuit; and based on a state of a first switch and a zero-crossing detection result, supplying power to the control circuit by the live wire power obtaining circuit or discharging to supply power to the control circuit by a tunable capacitor array.

As the above embodiments, by the switching circuit and the operation method of the present disclosure, the current peak value or the current average value can be decreased to avoid the load being activated by mistake.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
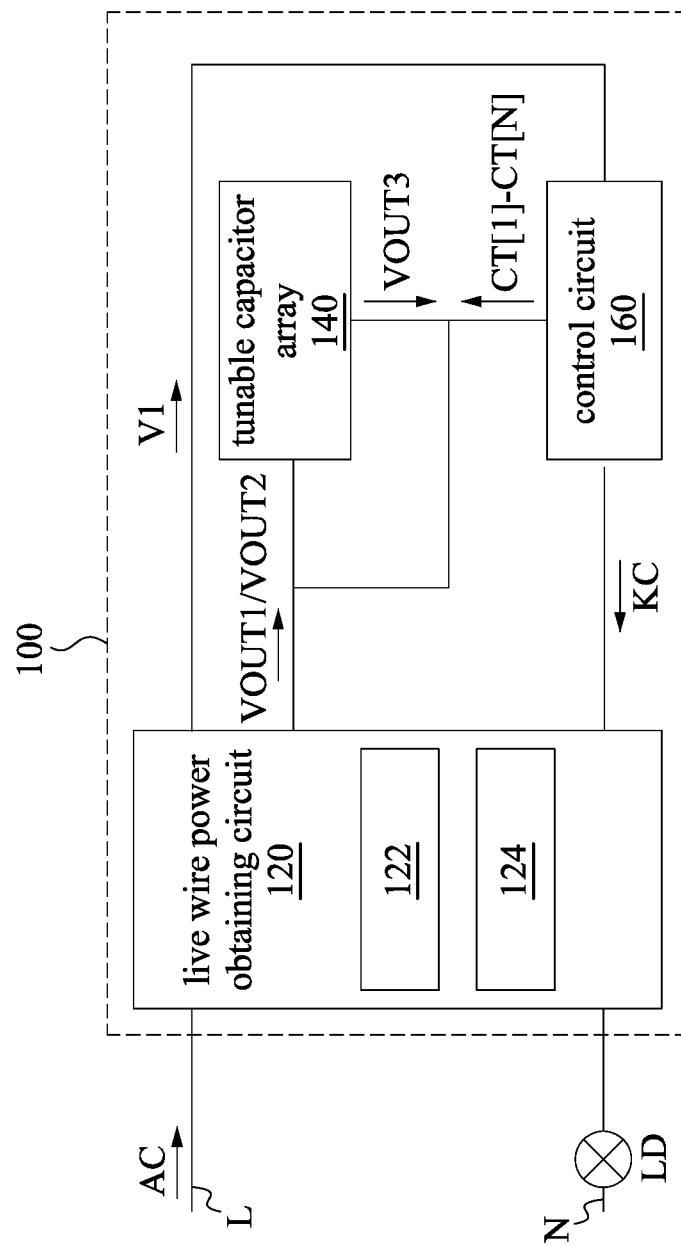
FIG. 1 is a functional block diagram illustrating a switching circuit, a live wire, a neutral wire, and a load according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

In the present disclosure, "connected" or "coupled" may refer to "electrically connected" or "electrically coupled." "Connected" or "coupled" may also refer to operations or actions between two or more elements.

Reference is made to FIG. 1. FIG. 1 is a functional block diagram illustrating a switching circuit 100, a live wire L, a neutral wire N, and a load LD according to some embodiments of the present disclosure. As illustrated in FIG. 1, the switching circuit 100 is coupled to the live wire L and the load LD. The load LD is coupled to the neutral wire N. The switching circuit 100 receives an alternating current voltage AC from the live wire L, and supplies power to the load LD according to the alternating current voltage AC. In some embodiments, the alternating current voltage AC is 220 volt, but the present disclosure is not limited thereto.

In some embodiments, the switching circuit 100 includes a live wire power obtaining circuit 120, a tunable capacitor array 140, and a control circuit 160. The live wire power obtaining circuit 120 is coupled between the live wire L and the load LD. The live wire power obtaining circuit 120 includes a power supply circuit 122 and a power supply circuit 124. The tunable capacitor array 140 is coupled to the live wire power obtaining circuit 120 and the control circuit 160. The control circuit 160 is coupled to the live wire power obtaining circuit 120. The live wire power obtaining circuit 120 receives the alternating current voltage AC from live wire L. The control circuit 160 performs a zero-crossing detection to the alternating current voltage AC. For example, the control circuit 160 would perform the zero-crossing detection to the voltage V1 in the live wire power obtaining circuit 120. In some embodiments, the phase of the voltage V1 is related to the phase of the alternating current voltage AC. Hence, performing the zero-crossing detection to the voltage V1 is the same to performing the zero-crossing detection to the alternating current voltage AC. Thus, it is able to determine the alternating current voltage AC is in a positive half-cycle (positive voltage) or in a negative half-cycle (negative voltage). Based on the zero-crossing detection result and a state of a switch (for example, a switch K1 in FIG. 2), it is determined that the live wire power obtaining circuit 120 supplies power to the control circuit 160 or the tunable capacitor array 140 discharges to supply power to the control circuit 160, such that the control circuit 160 operates normally. For example, the power supply circuit 122 (the power supply circuit 124) of the live wire power obtaining circuit 120 may output an output voltage VOUT1 (an output voltage VOUT2) to the control circuit 160. The tunable capacitor array 140 may discharge to output an output voltage VOUT3 to the control circuit 160. In some embodiments, the tunable capacitor array 140 is controlled by control signals CT[1]-CT[N] from the control circuit 160.

In some embodiments, the load LD is an illuminating device, but the present disclosure is not limited thereto. The control circuit 160 is a network module control chip. The network module control chip is, for example, a Wi-Fi SoC, but the present disclosure is not limited thereto. Thus, the smart house appliance system can execute a network-connection function (for example, Wi-Fi), to realize Internet of Things (IOT) system. The implementations of the load LD and the control circuit 160 are given for illustrative purposes only. Various implementations of the load LD and the control circuit 160 are within the contemplated scope of the present disclosure.

Because the tunable capacitor array 140 includes a plurality of capacitors with smaller capacitance values, the current peak value in the current loop is decreased, to avoid the load LD being activated by mistake. The capacitance values of the capacitors and the number of the capacitors may be designed according to the load LD (for example, watt of the illuminating device). In addition, the tunable capacitor array 140 is adopted to be an energy storage circuit, short life time and unsafety of traditional lithium batteries may be avoided.

Figure 2:
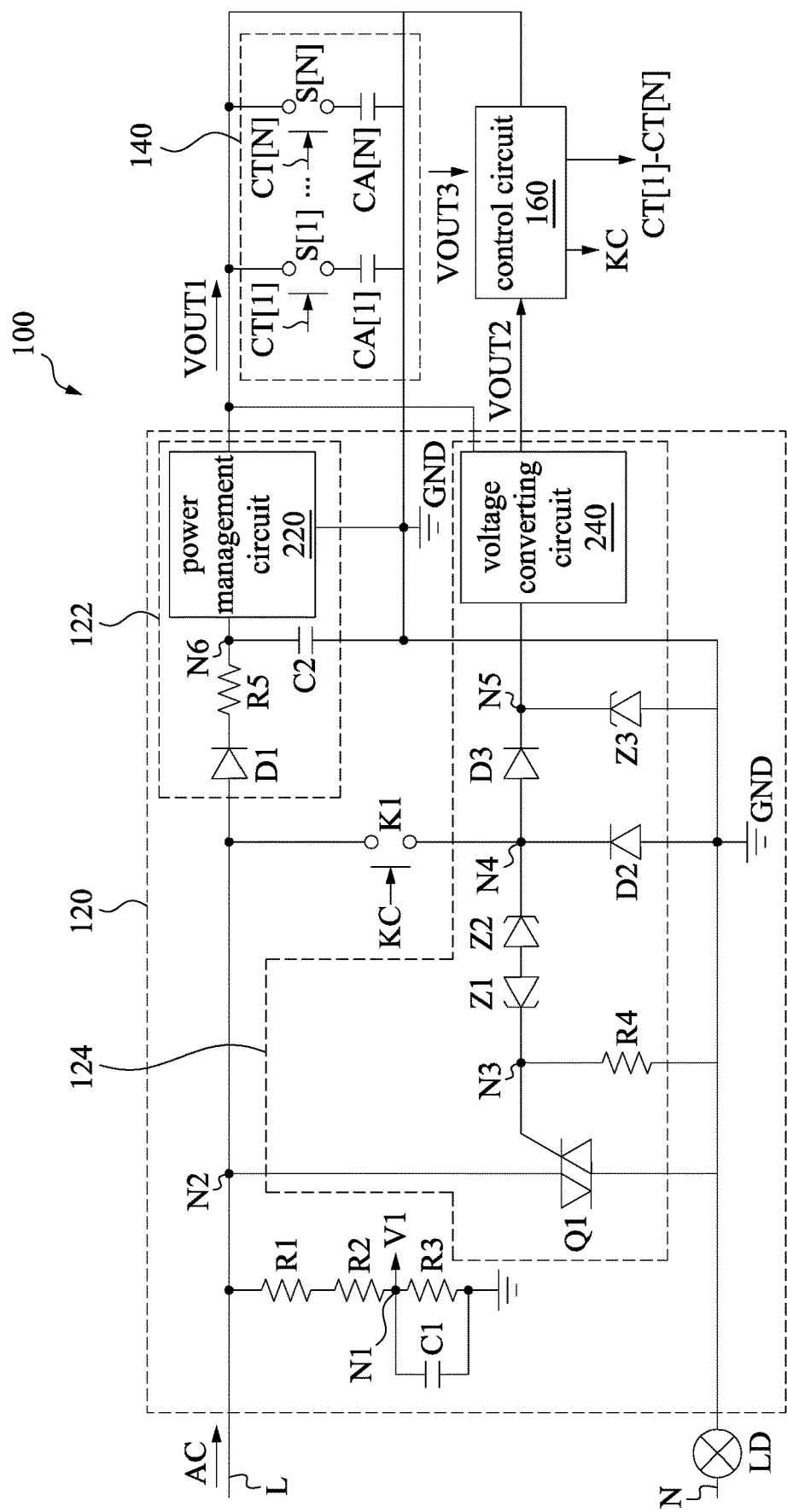
FIG. 2 is a circuit diagram illustrating the switching circuit, the live wire, the neutral wire, and the load according to some embodiments of the present disclosure.

Reference is made to FIG. 2. FIG. 2 is a circuit diagram illustrating the switching circuit 100, the live wire L, the neutral wire N, and the load LD in FIG. 1 according to some embodiments of the present disclosure.

In some embodiments, the power supply circuit 122 includes a diode D1, a resistor R5, a capacitor C2, and a power management circuit 220. The power supply circuit 124 includes a switch Q1, a resistor R4, voltage stabilization diodes Z1-Z3, diodes D2-D3, and a voltage converting circuit 240. The live wire power obtaining circuit 120 further includes resistors R1-R3, a capacitor C1, and the switch K1. As illustrated in FIG. 2, the live wire L is coupled to the resistor R1. The resistor R1 and the resistor R2 are coupled in series. The resistor R2 and the resistor R3 are coupled in series at a node N1. The capacitor C1 and the resistor R3 are coupled in parallel. The voltage V1 is generated at the node N1. As describe above, the control circuit 160 performs the zero-crossing detection to the voltage V1, to determine the alternating current voltage AC is in a positive half-cycle (positive voltage) or in a negative half-cycle (negative voltage). In addition, the switch Q1 is coupled between a node N2 and a ground terminal GND. In some embodiments, the switch Q1 is implemented by a Silicon Controlled Rectifier (SCR), but the present disclosure is not limited thereto. The resistor R4 is coupled between a node N3 and the ground terminal GND. The voltage stabilization diodes Z1 and Z2 are coupled between the node N3 and the node N4. The diode D2 is coupled between the node N4 and the ground terminal GND. The diode D3 is coupled between the node N4 and a node N5. The voltage stabilization diode Z3 is coupled between the node N5 and the ground terminal GND. The voltage converting circuit 240 is coupled between the node N5 and the control circuit 160. The switch K1 is coupled between the node N2 and the node N4. The diode D1 and the resistor R5 are coupled in series between the node N2 and the node N6. The capacitor C2 is coupled between the node N6 and the ground terminal GND. The power management circuit 220 is coupled among the node N6—the ground terminal GND, and the tunable capacitor array 140.

In some embodiments, the tunable capacitor array 140 includes N capacitors CA[1]-CA[N] and N switches S[1]-S[N]. Each of the capacitors CA[1]-CA[N] is coupled in series to a corresponding one of the switches S[1]-S[N], to form the tunable capacitor array 140. The switches S[1]-S[N] are respectively controlled by the control signals CT[1]-CT[N].

Operations of the switching circuit 100 are described in detail below.

When the switch K1 is controlled by a control signal KC to be turned off and the zero-crossing detection result is in a positive half-cycle, the power supply circuit 122 generates the output voltage VOUT1 according to the alternating current voltage AC, to supply power to the control circuit 160 and charge the tunable capacitor array 140. For example, when the user turns off the load LD, the control circuit 160 outputs the control signal KC to turn off the switch K1. If the alternating current voltage AC is in the positive half-cycle, the voltage V1 at node N1 is also in the positive half-cycle. At this time, the zero-crossing detection result is in the positive half-cycle. Because the switch K1 is turned off, the alternating current voltage AC is rectified via the diode D1 (half wave rectification) and is filtered via the resistor R5 and the capacitor C2. Accordingly, the power management circuit 220 generates the output voltage VOUT1, to supply power to the control circuit 160. Thus, even the user turns off the load LD (for example, the illuminating device), the control circuit 160 still operates normally, to maintain operations of the Internet of Things (IOT) system. In addition, the control circuit 160 would output the control signals CT[1]-CT[N] to the tunable capacitor array 140, to control at least some of the switches S[1]-S[N] to be turned on. Because at least some of the switches S[1]-S[N] are turned on, the output voltage VOUT1 is used to charge the tunable capacitor array 140. If the alternating current voltage AC is 220 volt, the circuit system is satisfied to the following formula (1):

$$NI \times 220 \times T = (I1 + I2) \times VOUT1 \qquad (1)$$

NI is a current on the neutral wire N, T is a transition effectiveness of the switching circuit 100, I1 is a current of the tunable capacitor array 140, and I2 is a working current of the control circuit 160.

When the switch K1 is controlled by the control signal KC to be turned off and the zero-crossing detection result is in a negative half-cycle, the tunable capacitor array 140 discharges to supply power to the control circuit 160. For example, when the user turns off the load LD, the control circuit 160 outputs the control signal KC to turn off the switch K1. If the alternating current voltage AC is in the negative half-cycle, the voltage V1 at the node N1 is also in the negative half-cycle. At this time, the zero-crossing detection result is in the negative half-cycle. The alternating current voltage AC with the negative half-cycle is rectified via the diode D1. The power management circuit 220 stops outputting the output voltage VOUT1. At this time, the control circuit 160 would output the control signals CT[1]-CT[N] to the tunable capacitor array 140, to control at least some of the switches S[1]-S[N] to be turned on. Thus, the tunable capacitor array 140 may discharge to generate the output voltage VOUT3. The output voltage VOUT3 may be configured to supply power to the control circuit 160, to ensure that the control circuit 160 is able to operate normally. At this time, if the alternating current voltage AC is 220 volt, the circuit system is satisfied to the following formula (2):

$$NI \times 220 \times T = I2 \times VOUT3 \qquad (2)$$

NI is a current on the neutral wire N, T is a transition effectiveness of the switching circuit 100, and I2 is a working current of the control circuit 160.

In addition, when a discharging voltage (the output voltage VOUT3) of the tunable capacitor array 140 is lower than a predetermined voltage, the control circuit 160 controls more of the switches S[1]-S[N] to be turned on, to increase and maintain the discharging voltage of the tunable capacitor array 140.

When the switch K1 is turned on and the zero-crossing detection result is in a positive half-cycle, the power supply circuit 124 generates the output voltage VOUT2 according to the alternating current voltage AC, to supply power to the control circuit 160 and charge the tunable capacitor array 140. For example, when the user turns on the load LD, the control circuit 160 outputs the control signal KC to turn on the switch K1. If the alternating current voltage AC is in the positive half-cycle, the voltage V1 at the node N1 is also in the positive half-cycle. At this time, the zero-crossing detection result is in the positive half-cycle. In addition, the control circuit 160 would output the control signals CT[1]-CT[N] to the tunable capacitor array 140, to control at least some of the switches S[1]-S[N] to be turned on. Because the switch K1 is turned on, the alternating current voltage AC flows through the switch K1. Accordingly, voltages at the node N4 and the node N3 would be increased (for example, 7 volt). At this time, the switch Q1 is turned on. The alternating current voltage AC flows to the load LD via the switch Q1. If the load LD is the illuminating device, the illuminating device is on. In addition, a voltage at the node N5 is increased according to the voltage at the node N4. The voltage converting circuit 240 converts the voltage at the node N5 (for example, decreasing the voltage at the node N5), to generate the output voltage VOUT2. The output voltage VOUT2 may be configured to supply power to the control circuit 160. In addition, the control circuit 160 would output the control signals CT[1]-CT[N] to the tunable capacitor array 140, to control at least some of the switches S[1]-S[N] to be turned on. Because at least some of the switches S[1]-S[N] are turned on, the output voltage VOUT2 may charge the tunable capacitor array 140.

When the switch K1 is turned on and the zero-crossing detection result is in a negative half-cycle, the tunable capacitor array 140 discharges to supply power to the control circuit 160. For example, when the user turns on the load LD, the control circuit 160 outputs the control signal KC to turn on the switch K1. If the alternating current voltage AC is in the negative half-cycle, the voltage V1 at the node N1 is also in the negative half-cycle. At this time, the zero-crossing detection result is in the negative half-cycle. The control circuit 160 would output the control signals CT[1]-CT[N] to the tunable capacitor array 140, to control at least of the switches S[1]-S[N] to be turned on. Thus, the tunable capacitor array 140 may discharge to generate the output voltage VOUT3. The output voltage VOUT3 may be configured to supply power to the control circuit 160, to ensure that the control circuit 160 is able to operate normally.

As describe above, in some embodiments, the control circuit 160 is a network module control chip. The network module control chip is, for example, a Wi-Fi SoC. The connection procedure of the network module control chip includes a scanning process, an authentication process, an association process, an extensible authentication protocol (EAP) process, and a dynamic host configuration protocol (DHCP) process. When the control circuit 160 executes the scanning process, a plurality channels need to be scanned. In some embodiments, a sleeping time is inserted between a scanning of one channel and another scanning of another channel. For example, when a scanning of a channel is finished, control circuit 160 enters a sleeping mode. When the sleeping mode is finished, a scanning of another channel is started. Thus, the current average value could be deceased, to avoid the load LID being activated by mistake. The time of the sleeping mode could be set according to practical needs.

In addition, in some embodiments, under a condition that the control circuit 160 (network module control chip) executes the EAP process, when a handshake between the control circuit 160 and a network base station is finished, the control circuit 160 would enter a sleeping mode. Thus, the current average value could be deceased, to avoid the load LD being activated by mistake. The time of the sleeping mode could be set according to practical needs.

In addition, in some embodiments, when the control circuit 160 (the network module control chip) executes a re-connection process, a re-connection number is set to be lower than a predetermined number. The predetermined number is, for example, 50, but the present disclosure is not limited thereto. In other related technology, the re-connection number is not limited. Compared to these related technology, the re-connection number of the control circuit 160 is lower than the predetermined number. Thus, the current average value could be deceased, to avoid the load LD being activated by mistake.

In addition, in some embodiments, the control circuit 160 executes a transmission process when the zero-crossing detection result is in a negative half-cycle. The transmission process may be controlled periodically. For example, periodically uploading some equipment state information to a server or periodically obtaining some internet information based on setting of the Internet of Things (IOT), but the present disclosure is not limited thereto. The control circuit 160 executes the transmission process when the zero-crossing detection result is in the negative half-cycle. Thus, the current peak value could be deceased, to avoid the load LD being activated by mistake.

Figure 3:
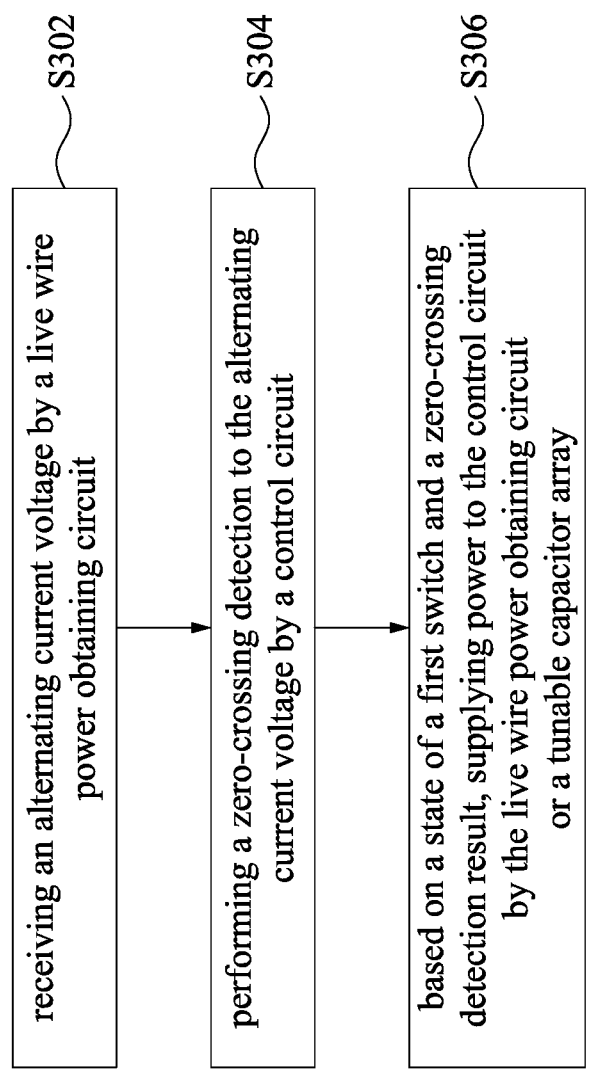
FIG. 3 is a flow diagram illustrating an operation method of a switching circuit according to some embodiments of the present disclosure.

Reference is made to FIG. 3. FIG. 3 is a flow diagram illustrating an operation method 300 of a switching circuit according to some embodiments of the present disclosure. The operation method 300 includes operations S302, S304, and S306. In some embodiments, the operation method 300 is implemented to the switching circuit 100 in FIG. 1, but the present disclosure is not limited thereto. For better understanding of the present disclosure, the operation method 300 is discussed with reference to FIG. 1.

In operation S302, the live wire power obtaining circuit 120 receives the alternating current voltage AC. In some embodiments, the live wire power obtaining circuit 120 is coupled to the live wire L to receive the alternating current voltage AC from the live wire L.

In operation S304, the control circuit 160 performs the zero-crossing detection to the alternating current voltage AC. In some embodiments, the control circuit 160 performs the zero-crossing detection to the voltage V1 at the node N1. The phase of voltage V1 is related to the phase of the alternating current voltage AC. Hence, performing the zero-crossing detection to the voltage V1 is the same to performing the zero-crossing detection to the alternating current voltage AC. Thus, it is able to determine the alternating current voltage AC is in a positive half-cycle (positive voltage) or in a negative half-cycle (negative voltage).

In operation S306, based on the state of the switch K1 and the zero-crossing detection result, the live wire power obtaining circuit 120 or the tunable capacitor array 140 supplies power to the control circuit 160. In some embodiments, when the switch K1 is turned off and the zero-crossing detection result is in the positive half-cycle, the power supply circuit 122 of the live wire power obtaining circuit 120 supplies power to the control circuit 160. When the switch K1 is turned off and the zero-crossing detection result is in the negative half-cycle, the tunable capacitor array 140 discharges to supply power to the control circuit 160. When the switch K1 is turned on and the zero-crossing detection result is in the positive half-cycle, the power supply circuit 124 of the live wire power obtaining circuit 120 supplies power to the control circuit 160. When the switch K1 is turned on and the zero-crossing detection result is in the negative half-cycle, the tunable capacitor array 140 discharges to supply power to the control circuit 160.

As the above embodiments, by the switching circuit and the operation method of the present disclosure, the current peak value or the current average value can be decreased to avoid the load being activated by mistake.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A switching circuit, comprising:
   a live wire power obtaining circuit coupled to a live wire to receive an alternating current voltage, wherein the live wire power obtaining circuit comprises:
   a first power supply circuit coupled to the live wire;
   a second power supply circuit coupled to the live wire; and
   a first switch coupled between the first power supply circuit and the second power supply circuit;
   a control circuit configured to perform a zero-crossing detection to the alternating current voltage; and
   a tunable capacitor array coupled to the live wire power obtaining circuit and the control circuit, wherein the control circuit is configured to control the live wire power obtaining circuit to supply power to the control circuit or the tunable capacitor array to discharge to supply power to the control circuit based on a state of the first switch and a zero-crossing detection result.

2. The switching circuit of claim 1,
   wherein when the first switch is turned off and the zero-crossing detection result is in a positive half cycle, the first power supply circuit outputs an output voltage according to the alternating current voltage to supply power to the control circuit and to charge the tunable capacitor array.

3. The switching circuit of claim 2, wherein when the first switch is turned off and the zero-crossing detection result is in a negative half cycle, the tunable capacitor array discharges to supply power to the control circuit.

4. The switching circuit of claim 1,
   wherein when the first switch is turned on and the zero-crossing detection result is in a positive half cycle, the second power supply circuit outputs an output voltage according to the alternating current voltage to supply power to the control circuit and to charge the tunable capacitor array.

5. The switching circuit of claim 4, wherein when the first switch is turned on and the zero-crossing detection result is in a negative half cycle, the tunable capacitor array discharges to supply power to the control circuit.

6. The switching circuit of claim 4, wherein the second power supply circuit comprises:
   a second switch coupled between the live wire and a load, wherein the alternating current voltage is provided to the load via the second switch.

7. The switching circuit of claim 1, wherein the tunable capacitor array comprises a plurality of capacitors, and wherein when a discharging voltage of the tunable capacitor array is lower than a predetermined voltage, the control circuit controls a plurality of switches corresponding to the capacitors to increase the discharging voltage.

8. The switching circuit of claim 1, wherein the control circuit comprises a network module control chip, wherein under a condition that the network module control chip executes a scanning process, the network module control chip enters a sleeping mode after a scanning of a first channel is finished, and a second channel is scanned after the sleeping mode is finished.

9. The switching circuit of claim 8, wherein the network module control chip enters a sleeping mode after a handshake between the network module control chip and a network base station is finished.

10. The switching circuit of claim 8, wherein when the network module control chip executes a re-connection process, a re-connection number of the network module control chip is lower than a predetermined number.

11. The switching circuit of claim 8, wherein the network module control chip executes a transmission process when the zero-crossing detection result is in a negative half cycle.

12. A switching circuit, comprising:
   a live wire power obtaining circuit coupled to a live wire to receive an alternating current voltage; and
   a control circuit configured to control the live wire power obtaining circuit or an energy storage circuit to supply power to the control circuit according to a state of a switch and the alternating current voltage, wherein the control circuit comprises a network module control chip, wherein under a condition that the network module control chip executes a scanning process, the network module control chip enters a sleeping mode after a scanning of a first channel is finished, and a second channel is scanned after the sleeping mode is finished.

13. The switching circuit of claim 12, wherein the network module control chip enters a sleeping mode after a handshake between the network module control chip and a network base station is finished.

14. The switching circuit of claim 12, wherein when the network module control chip executes a re-connection process, a re-connection number of the network module control chip is lower than a predetermined number.

15. The switching circuit of claim 12, wherein the network module control chip executes a transmission process when the alternating current voltage is in a negative half cycle.

16. An operation method of a switching circuit, comprising:
- receiving an alternating current voltage by a live wire power obtaining circuit, wherein the live wire power obtaining circuit comprises a first power supply circuit coupled to the live wire, a second power supply circuit coupled to the live wire, and a first switch coupled between the first power supply circuit and the second power supply circuit;
- performing a zero-crossing detection to the alternating current voltage by a control circuit; and
- based on a state of the first switch and a zero-crossing detection result, supplying power to the control circuit by the live wire power obtaining circuit or discharging to supply power to the control circuit by a tunable capacitor array.

17. The operation method of claim 16, further comprising:
generating an output voltage according to the alternating current voltage to supply power to the control circuit and to charge the tunable capacitor array by the first power supply circuit of the live wire power obtaining circuit when the first switch is turned off and the zero-crossing detection result is in a positive half cycle.

18. The operation method of claim 17, further comprising:
discharging to supply power to the control circuit by the tunable capacitor array when the first switch is turned off and the zero-crossing detection result is in a negative half cycle.

19. The operation method of claim 16, further comprising:
generating an output voltage according to the alternating current voltage to supply power to the control circuit and to charge the tunable capacitor array by the second power supply circuit of the live wire power obtaining circuit when the first switch is turned on and the zero-crossing detection result is in a positive half cycle.

20. The operation method of claim 19, further comprising:
discharging to supply power to the control circuit by the tunable capacitor array when the first switch is turned on and the zero-crossing detection result is in a negative half cycle.

* * * * *